United States Patent
Minciunescu et al.

(10) Patent No.: US 11,940,476 B2
(45) Date of Patent: Mar. 26, 2024

(54) THREE-PHASE POWER METER MONITORING FOR STAR AND DELTA CONFIGURATIONS

(71) Applicant: Analog Devices International Unlimited Company, Limerick (IE)

(72) Inventors: Petre Minciunescu, Summerfield, NC (US); Seyed Amir Ali Danesh, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 284 days.

(21) Appl. No.: 17/350,812

(22) Filed: Jun. 17, 2021

(65) Prior Publication Data

US 2021/0382097 A1 Dec. 9, 2021

Related U.S. Application Data

(63) Continuation of application No. 16/355,192, filed on Mar. 15, 2019, now Pat. No. 11,061,055.

(51) Int. Cl.
*G01R 21/133* (2006.01)
*G01R 15/18* (2006.01)

(52) U.S. Cl.
CPC ......... *G01R 21/133* (2013.01); *G01R 15/181* (2013.01)

(58) Field of Classification Search
CPC .. G01R 21/133; G01R 15/181; G01R 21/001; G01R 21/1331; G01R 21/06; G01R 21/00
USPC ....................................................... 324/107
See application file for complete search history.

(56) References Cited

U.S. PATENT DOCUMENTS

| | | |
|---|---|---|
| 5,652,505 A | 7/1997 | Brune |
| 6,112,158 A | 8/2000 | Bond et al. |
| 6,141,626 A | 10/2000 | Holdsclaw et al. |
| 9,829,519 B2 | 11/2017 | Hayashi et al. |
| 9,897,647 B2 | 2/2018 | Hayashi et al. |
| 11,061,055 B2 | 7/2021 | Minciunescu et al. |

(Continued)

FOREIGN PATENT DOCUMENTS

| | | |
|---|---|---|
| CN | 2363286 Y | 2/2000 |
| CN | 201043982 Y | 4/2008 |

(Continued)

OTHER PUBLICATIONS

"U.S. Appl. No. 16/355,192, 312 Amendment filed Apr. 23, 2021", 8 pgs.

(Continued)

*Primary Examiner* — Tung X Nguyen
*Assistant Examiner* — Robert P Alejnikov, Jr.
(74) *Attorney, Agent, or Firm* — Schwegman Lundberg & Woessner, P.A.

(57) ABSTRACT

A three-phase power meter can monitor power on both 3-wire and 4-wire power lines. The power meter measures at least two voltages between phase conductors of the power line, and at least one voltage between a phase conductor and a neutral conductor of the power line when the neutral conductor is available. Using at least some of the measured voltages, the power meter can then operate in a first mode when coupled to a 3-wire power line to determine power on the power line based on the measured voltages, or operate in a second mode when coupled to a 4-wire power line to determine power on the power line based on the measured voltages.

20 Claims, 7 Drawing Sheets

(56) References Cited

U.S. PATENT DOCUMENTS

| | | |
|---|---|---|
| 2005/0240362 A1 | 10/2005 | Randall |
| 2008/0097707 A1* | 4/2008 | Voisine ............... G01R 21/1331 |
| | | 702/61 |
| 2011/0089934 A1* | 4/2011 | King ....................... G01R 21/06 |
| | | 324/141 |
| 2011/0267032 A1 | 11/2011 | Zhang et al. |
| 2012/0089354 A1* | 4/2012 | Holdsclaw ............. G01R 22/10 |
| | | 702/64 |
| 2014/0300344 A1* | 10/2014 | Turner ................. G01R 21/133 |
| | | 324/107 |
| 2015/0042311 A1 | 2/2015 | Gao et al. |
| 2016/0349311 A1 | 12/2016 | Hayashi et al. |
| 2018/0143237 A1* | 5/2018 | Beaudet ................. G01R 31/42 |
| 2018/0224486 A1 | 8/2018 | Voisine |
| 2020/0127458 A1 | 4/2020 | Kato et al. |
| 2020/0292597 A1 | 9/2020 | Minciunescu et al. |

FOREIGN PATENT DOCUMENTS

| | | |
|---|---|---|
| CN | 201352235 Y | 11/2009 |
| CN | 102680779 | 9/2012 |
| CN | 102818929 | 12/2012 |
| CN | 202948051 | 5/2013 |
| CN | 106018985 A | 10/2016 |
| CN | 106370902 A | 2/2017 |
| CN | 104865428 B | 6/2017 |
| CN | 208367149 | 1/2019 |
| GB | 8329484 | 12/1983 |
| GB | 2149128 A | 6/1985 |
| JP | 2000074958 A | 3/2000 |
| KR | 20170091220 A | 8/2017 |

OTHER PUBLICATIONS

"U.S. Appl. No. 16/355,192, Non Final Office Action dated Dec. 7, 2020", 12 pgs.

"U.S. Appl. No. 16/355,192, Notice of Allowance dated Mar. 18, 2021", 5 pgs.

"U.S. Appl. No. 16/355,192, PTO Response to Rule 312 Communication dated May 3, 2021", 2 pgs.

"U.S. Appl. No. 16/355,192, Response filed Mar. 5, 2021 to Non Final Office Action dated Dec. 7, 2020", 11 pgs.

"European Application Serial No. 20159499.1, Extended European Search Report dated Aug. 18, 2020", 13 pgs.

"High Performance, Multiphase Energy, and Power Quality Monitoring IC—ADE9000", Analog Devices Data Sheet, (2017), 72 pgs.

"Isolated Energy Metering Chipset for Polyphase Shunt Meters", Analog Devices Data Sheet, (2018), 125 pgs.

"Polyphase Multifunction Energy Metering IC with Serial Port—ADE7754", Analog Devices Data Sheet, (2003), 44 pgs.

"Chinese Application Serial No. 202010175361.5, Office Action dated Jun. 9, 2022", w/ English Translation, 21 pgs.

"European Application Serial No. 20159499.1, Communication Pursuant to Article 94(3) EPC dated Aug. 1, 2022", 8 pgs.

"Chinese Application Serial No. 202010175361.5, Office Action dated Jan. 19, 2023", w/ English Machine Translation, 24 pgs.

"Chinese Application Serial No. 202010175361.5, Response filed Apr. 3, 2023 to Office Action dated Jan. 19, 2023", w/English Claims, 14 pgs.

* cited by examiner

THREE-PHASE POWER METER MONITORING FOR STAR AND DELTA CONFIGURATIONS

CLAIM OF PRIORITY

This is a continuation of U.S. application Ser. No. 16/355,192, filed on Mar. 15, 2019, which is hereby incorporated by reference herein in its entirety.

FIELD OF THE DISCLOSURE

The present disclosure relates to a power meter for monitoring power on a three-phase power line.

BACKGROUND

In electrical power systems, a power source may deliver power to a load over a three-phase power line. In general, there are two types of three-phase power line: 3-phase 4-wire power lines (also known as "star" or "wye" configuration), and 3-phase 3-wire power lines (also known as "delta" configuration). A 4-wire power line comprises three phase conductors A, B and C, and a neutral conductor N. A 3-wire power line comprises three phase conductors A, B and C, and no neutral conductor N.

Power meters may employ Blondel's Theorem when monitoring the power on a 4-wire or 3-wire power line. A power meter for monitoring a 4-wire power line may include circuitry to measure voltages on each of the three phase conductors with reference to the neutral conductor, and the currents on each phase conductor, in order to determine power. A power meter for monitoring a 3-wire power line may include circuitry to measure voltages on two of the phase conductors with reference to a third phase conductor, and currents on two of the phase conductors, in order to determine power.

Power meter manufacturers therefore manufacture different power meters with different circuitry for each type of power line due to the different voltage and current measurement requirements. This results in high manufacturing and production costs.

SUMMARY OF THE DISCLOSURE

The present disclosure provides a three-phase power meter for monitoring power on both 3-wire and 4-wire power lines. The power meter measures at least two voltages between phase conductors of the power line, and at least one voltage between a phase conductor and a neutral conductor of the power line when the neutral conductor is available. Using at least some of the measured voltages, the power meter can then operate in a first mode when coupled to a 3-wire power line to determine power on the power line based on the measured voltages, or operate in a second mode when coupled to a 4-wire power line to determine power on the power line based on the measured voltages.

In a first aspect of the present disclosure, there is provided a three-phase power meter comprising front-end circuit (FEC). The FEC is configured for coupling to a three wire or a four wire three-phase power line comprising a plurality of conductors. The FEC is also configured to generate a plurality of signals indicative of voltages between respective pairs of conductors. The power meter further comprises a processing unit. The processing unit is coupled to the FEC, and configured to receive the plurality of signals, and to determine the power of the three-phase power line. The power meter is configured to operate in a first mode, in order to determine the power of a three wire three-phase power line, and in a second mode, in order to determine the power of a four wire three-phase power line.

In a second aspect of the present disclosure, there is provided a front-end circuit (FEC) for use in a three-phase power meter. The FEC is configured for coupling to a three wire or a four wire three-phase power line comprising a plurality of conductors, and to generate a plurality of signals indicative of voltages between respective pairs of conductors of the three-phase power line, such that the three-phase power meter may determine a power of a three-phase three-wire power line in a first mode, and determine a power of a three-phase four-wire power line in a second mode.

In a third aspect of the present disclosure, there is provided a method of determining the power of a three wire or a four wire three-phase power line using a three-phase power meter, the three-phase power line comprising a plurality of conductors. The method comprises steps of: receiving, using a processing unit, a plurality of signals indicative of voltages between respective pairs of conductors; determining whether the three-phase power meter is coupled to a three wire power line or a four wire power line; processing the plurality of signals, using the processing unit, in order to determine the power on the three-phase power line, wherein the manner in which the plurality of signals are processed is dependent upon whether the meter is coupled to a three wire or four wire power line.

In a fourth aspect of the present disclosure, there is provided a processing unit arranged to carry out the method of the third aspect of the present disclosure.

Further features, embodiments, examples, and advantages of the present disclosure will be apparent from the following description and from the appended claims.

DETAILED DESCRIPTION

Figure 6A:
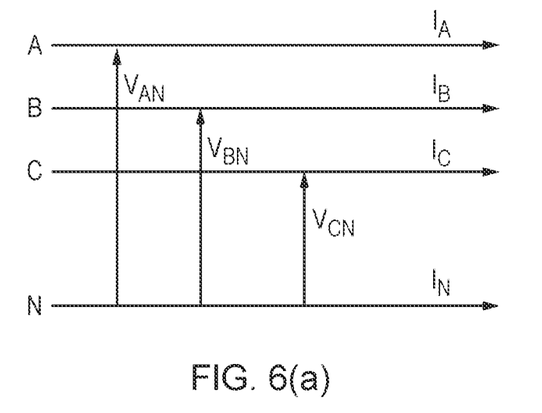
FIGS. 6(a)-(c) show conceptual diagrams of three-phase power lines.

In an approach, separate power meters are used for monitoring 3-phase 4-wire and 3-phase 3-wire power lines. This is due to the power calculations for each type of power line using different voltage measurements. The power calculation for a 3-phase 4-wire line uses voltages measured at each phase conductor A, B, C, with reference to the neutral conductor N. This is illustrated, for example, in FIG. 6(a). Although the voltage on each power line conductor is time-varying, the instantaneous values of the voltages between the phase conductors A, B, C and neutral N are denoted as $V_{AN}$, $V_{BN}$, $V_{CN}$. Hence, 3-phase 4-wire power meters may be specifically configured to measure the voltages $V_{AN}$, $V_{BN}$, $V_{CN}$.

Figure 6B:
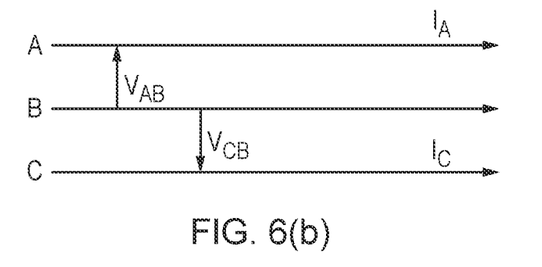

The power calculation for a 3-phase 3-wire line uses the voltages measured at two of the phase conductors with reference to another phase conductor. For example, the power calculation for a 3-phase 3-wire line may use the voltages measured at the phase conductors A, C with reference to the remaining phase conductor B. This is illustrated, for example, in FIG. 6(b), where $V_{AB}$ and $V_{CB}$ denote instantaneous voltages between the phase conductors A and B, and C and B, respectively. Hence, 3-phase 3-wire power meters may be specifically configured to measure the voltages $V_{AB}$, and $V_{CB}$. 3-phase 3-wire meters may similarly determine power by measuring voltages at the phase conductors B, C with reference to the phase conductor A, or by measuring voltages at the phase conductors A, B with reference to the phase conductor C.

In any case, power meters for 3-wire and 4-wire power lines require different circuitry and hardware to measure the completely different sets of voltages ($V_{AN}$/$V_{BN}$/$V_{CN}$ or $V_{AB}$/$V_{CB}$) for the respective power computations. Manufacturers therefore produce separate power meters for 3-wire and 4-wire scenarios. The present disclosure relates to a three-phase power meter that can be used to monitor both 3-phase 3-wire power lines and 3-phase 4-wire power lines. In particular, the power meter of the present disclosure is configured to measure a combination of voltages across the power line conductors which can be used to determine the power of a three-phase power line in both 3-wire and 4-wire scenarios. The power meter is configured to then operate in a 3-wire mode to determine the power on the power line based on the measured voltages, or operate in a 4-wire mode to determine the power on the power line based on the measured voltages.

The power meter of the present disclosure is arranged to measure the voltages at the phase conductors A, C with reference to the remaining phase conductor B ($V_{AB}$ and $V_{CB}$). Furthermore, the power meter is also arranged to measure the voltage between the phase conductor B and the neutral conductor N ($V_{BN}$) when the neutral conductor is available. This is illustrated, for example, in FIG. 6(c). The power meter also measures the current on each phase conductor.

When the power meter is coupled to a 3-wire power line, the power meter may operate in the first mode and determine the power based on the voltages $V_{AB}$ and $V_{CB}$. In this case, a neutral conductor is not coupled to the power meter, and therefore the voltage $V_{BN}$ is not used, similar to FIG. 6(b). Nevertheless, the voltage $V_{BN}$ is not necessary for determining the power in a 3-wire scenario.

When the power meter is coupled to a 4-wire power line, the power meter may operate in the second mode to determine the power based on the voltages $V_{AB}$, $V_{CB}$ and $V_{BN}$. In this case, a neutral conductor is coupled to the power meter, and the voltage $V_{BN}$ is used. Based on the instantaneous voltages $V_{AB}$, $V_{CB}$ and $V_{BN}$, the power meter first determines the instantaneous voltages $V_{AN}$ and $V_{CN}$. $V_{AN}$ may be determined as $V_{AN}=V_{AB}+V_{BN}$. $V_{CN}$ may be determined as $V_{CN}=V_{CB}+V_{BN}$. The power meter may then determine the power on the 4-wire line using the measured voltage $V_{BN}$, and the determined voltages $V_{AN}$ and $V_{CN}$, similar to FIG. 6(a).

Figure 6C:
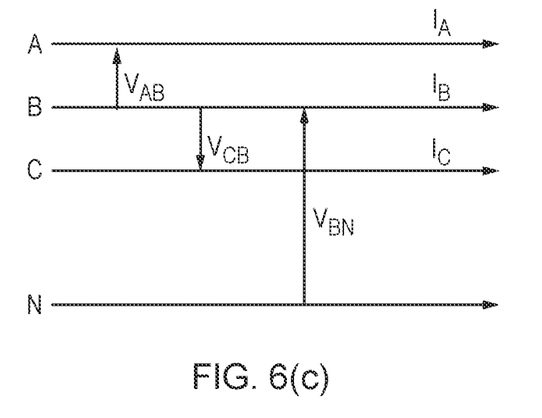

The present disclosure therefore provides a power meter that can be used in both 3-wire and 4-wire scenarios. The power meter avoids the need to measure completely different sets of voltages in each scenario. Rather, the power meter is configured to measure the voltages $V_{AB}$, $V_{CB}$, $V_{BN}$ as shown in FIG. 6(c), and uses at least some of those voltages to determine the power based on its operating mode. Advantageously, the power meter of the present disclosure allows for a reduction in manufacturing, product management, and storage costs associated producing two separate power meters for each 3-wire and 4-wire scenario.

Embodiments of the present disclosure are described in more detail as follows.

Figure 1:
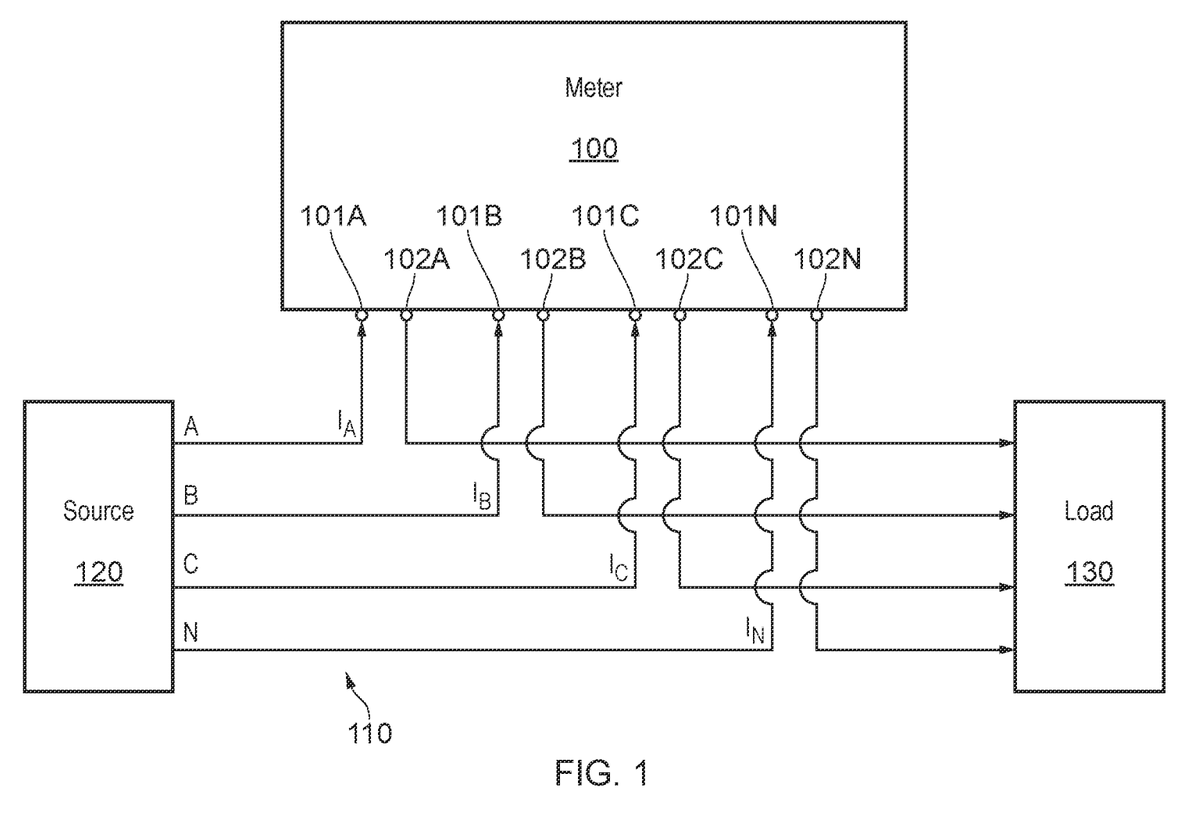
FIG. 1 shows a three-phase power line metering environment and a three-phase power meter in accordance with an embodiment of the present disclosure.

FIG. 1 shows a three-phase power meter 100 in accordance with an embodiment of the present disclosure.

The meter 100 is arranged for coupling to a three-phase power line. As shown in the example of FIG. 1, a three-phase power line 110 may comprise phase conductors A, B, and C, and a neutral conductor N. This is also known as a 3-phase 4-wire power line. The meter 100 may be coupled to the three-phase power line 110 between a power source 120 and a load 130. Phase conductors of power lines are the conductors that deliver current and power to the load. In the case of a 4-wire power line, the neutral conductor is usually the common reference point for the load which may be connected to ground at the load.

The meter 100 comprises a plurality of terminals 101A, 102A, 101B, 102B, 101C, 102C, 101N and 102N for coupling to the three-phase power line 110. The plurality of terminals 101A, 101B, 101C and 101N may be considered as input terminals, and the terminals 102A, 102B, 102C and 102N may be considered as output terminals.

The input terminals 101A, 101B, 101C and 101N are arranged to receive and couple to respective conductors from the source 120 side of the three-phase power line 110. The terminal 101A is arranged to receive the phase conductor A from the source 120 side of the three-phase power line 110. Furthermore, the terminal 101B is arranged to receive the phase conductor B, the terminal 101C is arranged to receive the phase conductor C, and the terminal 101N is arranged to receive the neutral conductor N from the source 120 side of the three-phase power line 110.

The output terminals 102A, 102B, 102C and 102N are arranged to receive and couple to respective conductors from the load 130 side of the three-phase power line 110. The terminal 102A is arranged to receive the phase conductor A from the load 130 side of the three-phase power line 110. Furthermore, the terminal 102B is arranged to receive the phase conductor B, the terminal 102C is arranged to receive the phase conductor C, and the terminal 102N is arranged to receive the neutral conductor N from the load 130 side of the three-phase power line 110.

Therefore, the meter 100 may be connected to the power line 110 at a point on the three-phase power line 110 between the power source 120 and the load 130. Furthermore, as explained in more detail below, the meter 100 is arranged such that a current flow $I_A$, $I_B$, $I_C$, $I_N$ on each conductor A, B, C and N between the source 120 and load 130 is permitted whilst the meter 100 is coupled to the power line 110. Connecting the meter 100 to the power line 110 may involve creating a break in each conductor and coupling each side of the broken conductor to the meter 100 as described above.

The three-phase power line 110 in the example of FIG. 1 is shown having three phase conductors A, B, and C, and a neutral conductor N. This is also referred to as a 3-phase 4-wire power line or a "star" or "wye" configuration. The meter 100 may also be coupled to a three-phase power line having three phase conductors A, B and C, and no neutral conductor N, otherwise referred to as a 3-phase 3-wire power line, or a "delta" configuration. In the case of a 3-phase 3-wire line, the terminals 101A, 102A, 101B, 102B, 101C, 102C may be coupled to the phase conductors as described above. However, the terminals 101N and 102N may be left uncoupled or floating due to absence of a neutral conductor.

Figure 2:
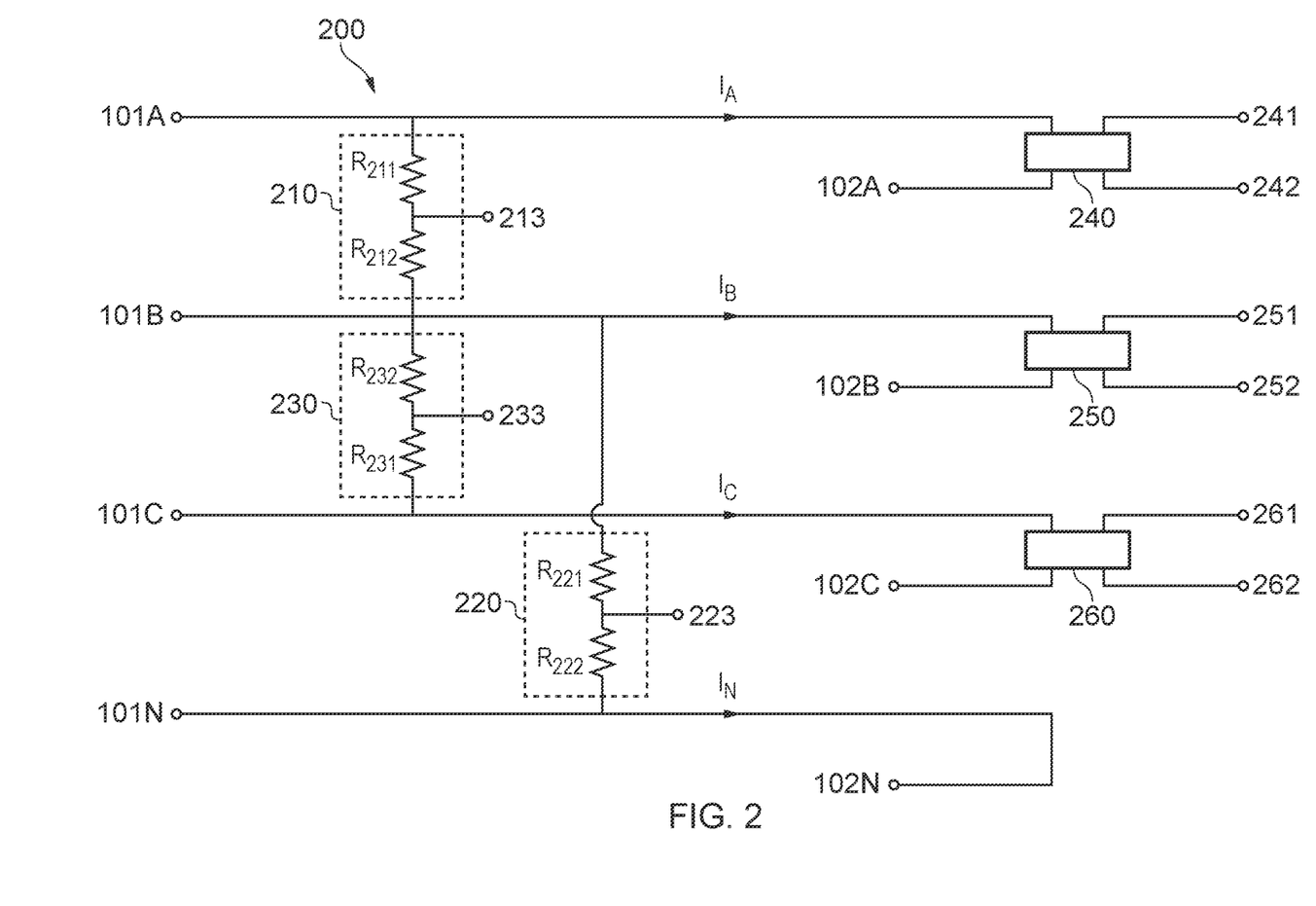
FIG. 2 shows front end circuitry (FEC) of a three-phase power meter in accordance with an embodiment of the present disclosure.

FIG. 2 shows front end circuitry (FEC) 200 of the three-phase power meter 100 according to an embodiment of the present disclosure. The FEC 200 is arranged to couple or interface with the power line 110 via the terminals of the meter 100. The FEC 200 is arranged to output signals indicative of voltages between conductors of the power line, and indicative of currents on the conductors of the power line. As described in more detail below, the FEC 200 is configured to provide the output signals at voltage levels suitable for measuring by a processing unit.

The FEC 200 comprises a plurality of current sensors 240, 250 and 260. Each current sensor 240, 250 and 260 is arranged between respective pairs of the input and output terminals of the meter 100. Each current sensor is arranged to output a voltage signal indicative of a current flowing between the respective input and output terminals of the meter 100.

The current sensor 240 is arranged between the input terminal 101A and the output terminal 102A. The current sensor 240 permits a current flow $I_A$ between the input terminal 101A and the output terminal 102A, such that the current flow $I_A$ between the input terminal 101A and the output terminal 102A is uninterrupted by the current sensor 240. Hence, when the terminals 101A and 102A are coupled to a phase conductor A of a three-phase power line, the current flow $I_A$ from the power source 120, through the conductor A and the meter 100 and to the load 130, will not be interrupted.

The current sensor 240 comprises output nodes 241 and 242. The current sensor 240 is configured to produce a voltage signal $V_{IA}'$ across the output nodes 241 and 242 in response to the current $I_A$ flowing between the terminals 101A and 102A. As such, the voltage signal $V_{IA}'$ across the output nodes 241 and 242 is indicative of the current $I_A$ flowing between the terminals 101A and 102A. Furthermore, when the meter 100 is coupled to a three-phase power line as shown in FIG. 1 or otherwise, the current $I_A$ corresponds to the current flowing through the phase conductor A of the power line. Therefore, the voltage signal $V_{IA}'$ across the output nodes 241 and 242 may be indicative of the current $I_A$ flowing through the phase conductor A.

The current sensor 250 is arranged between the input terminal 101B and the output terminal 102B. The current sensor 250 substantially corresponds to the current sensor 240 described above. As such, a voltage signal $V_{IB}'$ across output nodes 251 and 252 is indicative of the current $I_B$ flowing between the terminals 101B and 102B. Furthermore, when the meter 100 is coupled to a three-phase power line as shown in FIG. 1 or otherwise, the current $I_B$ corresponds to the current flowing through the phase conductor B of the power line. Therefore, the voltage signal $V_{IB}'$ across the output nodes 251 and 252 may be indicative of the current $I_B$ flowing through the phase conductor B.

The current sensor 260 is arranged between the input terminal 101C and the output terminal 102C. The current sensor 260 substantially corresponds to the current sensors 240 and 250 as described above. As such, a voltage signal $V_{IC}'$ across output nodes 261 and 262 is indicative of the current $I_C$ flowing between the terminals 101C and 102C. Furthermore, when the meter 100 is coupled to a three-phase power line as shown in FIG. 1 or otherwise, the current $I_C$ corresponds to the current flowing through the phase conductor C of the power line. Therefore, the voltage signal $V_{IC}'$ across the output nodes 261 and 262 may be indicative of the current $I_C$ flowing through the phase conductor C.

In some embodiments, the current sensors 240, 250 and 260 may comprise a current transformer. In such embodiments, each current transformer may be positioned around conductors between respective terminals of the FEC 200. In particular, each current transformer may comprise a coil winding wrapped around an annular core. The annular core may be positioned around the conductors between the respective terminals of the FEC 200. For example, the current sensor 240 may comprise a current transformer positioned around the conductor between the terminals 101A and 102A, the current sensor 250 may comprise a current transformer positioned around the conductor between the terminals 101B and 102B, and the current sensor 260 may comprise a current transformer positioned around the conductor between the terminals 101C and 102C. The voltage signals at the output nodes of the current sensors may be the voltage between two ends of the coil winding. For example, the voltage signal $V_{IA}'$ between output nodes 241 and 242 may be the voltage between the ends of the coil winding of the current sensor 240, the voltage signal $V_{IB}'$ between output nodes 251 and 252 may be the voltage between the ends of the coil winding of the current sensor 250, and the voltage signal $V_{IC}'$ between output nodes 261 and 262 may be the voltage between the ends of the coil winding of the current sensor 260. In some embodiments, the current transformer of each current sensor may be a Rogowski coil.

In the above description, the current transformers of the current sensors 240, 250 and 260 have been described as being arranged internal to the FEC 200 around the conductors between the terminals 101 and 102. In some embodiments, the current transformers may be coupled directly around the phase conductors of the three-phase power line. For example, with reference to FIG. 1, the current transformers may be coupled directly around each phase conductor A, B, C, external to the meter 100. In any case, the current transformers may be coupled around any conductor carrying the respective currents $I_A$, $I_B$ and $I_C$ in order to sense those currents.

In further embodiments, the current sensors may each comprise a shunt resistor. In such embodiments, each shunt resistor may be arranged in series between the respective terminals of the meter 100 and FEC 200. For example, the current sensor 240 may comprise a shunt resistor between the terminals 101A and 102A, the current sensor 250 may comprise a shunt resistor between the terminals 101B and 102B, and the current sensor 260 may comprise a shunt resistor between the terminals 101C and 102C. The voltage signals at the output nodes of the current sensors may be the voltage across the respective shunt resistor. For example, the voltage signal $V_{IA}'$ between output nodes 241 and 242 may be the voltage across the shunt resistor of the current sensor 240, the voltage signal $V_{IB}'$ between output nodes 251 and 252 may be the voltage across the shunt resistor of the current sensor 250, and the voltage signal $V_{IC}'$ between output nodes 261 and 262 may be the voltage across the shunt resistor of the current sensor 260. Each shunt resistor may be small valued. For example, the shunt resistor may range from 100μΩ to several mΩ. The shunt resistor may be chosen as any suitable value depending on the current and power dissipation limits of the power line using known techniques.

In other embodiments, the current sensors may comprise hall-effect current sensors for sensing the current on each phase conductor. Any other type of current sensor known in the art may also be used to produce the voltage signals $V_{IA}'$, $V_{IB}'$ and $V_{IC}'$ indicative of the currents $I_A$, $I_B$, $I_C$.

As shown in FIG. 2, there is no current sensor provided between the neutral terminals 101N and 102N. Rather, the neutral terminals 101N and 102N are directly short circuited. Hence, when the meter is coupled to a three-phase power line having a neutral conductor, the meter may permit the current flow $I_N$ between the terminals 101N and 102B, and therefore the current flow $I_N$ through the neutral conductor N of the three-phase power line. In some embodiments, the meter 100 may be arranged to sense the neutral current $I_N$, which is explained in more detail below.

The front end circuitry 200 further comprises a plurality of voltage dividers 210, 220 and 230. Each voltage divider is arranged between a respective pair of the input terminals 101A, 101B, 101C and 101N. Each voltage divider is arranged to output a signal indicative of the voltage across the respective pair of the input terminals. When the meter 100 is coupled to a power line, such as the power line 110 in FIG. 1 or otherwise, each voltage divider outputs a signal indicative of the voltage across the respective pair of power line conductors.

The voltage divider 210 is arranged between the input terminals 101A and 101B. The voltage divider 210 comprises two resistors $R_{211}$ and $R_{212}$. The resistors $R_{211}$ and $R_{212}$ are arranged in series between the input terminals 101A and 101B. The voltage divider 210 also comprises an intermediate node 213 at a common point between the resistors $R_{211}$ and $R_{212}$. The voltage divider 210 is arranged to divide a voltage $V_{AB}$, where $V_{AB}$ is the voltage across the terminals 101A and 101B. The divided voltage is provided as the voltage signal $V_{AB}'$ at the intermediate node 213, for example, when referenced to the terminal 101B. By virtue of the resistor arrangement, the voltage divider may be characterised by the equation:

$$V_{AB}' = V_{AB} * R_{212} / (R_{211} + R_{212})$$

The voltage signal $V_{AB}'$ at the intermediate node 213 is therefore indicative of the voltage $V_{AB}$ across the terminals 101A and 101B. Furthermore, when the meter 100 is coupled to a three-phase power line as shown in FIG. 1 or otherwise, the voltage signal $V_{AB}$ across the terminals 101A and 101B corresponds to the voltage across the phase conductors A and B of the power line. Therefore, the voltage signal $V_{AB}'$ at the intermediate node 213 may be indicative of the voltage $V_{AB}$ across the phase conductors A and B of the three phase power line.

The values of the resistors in the voltage divider 210 and the resulting voltage division may be chosen appropriately using known techniques, such that the divided voltage can be measured by other components of the meter 100, whilst also meeting the safety and maximum ratings of those components. For example, the values of the resistors may be chosen such that the voltages can be measured by the processing unit 300 and its components described below, whilst also meeting their safety and maximum ratings. In one example, the resistor R211 maybe in the range of 1 kΩ or more, and the resistor R212 may be in the range of 1 MΩ or more.

The voltage divider 220 is arranged between the input terminals 101B and 101N and comprises resistors $R_{221}$ and $R_{222}$. The arrangement of the voltage divider 220 is substantially similar to the arrangement of the voltage divider 210 and is therefore characterised by a similar equation and similar resistor values. The voltage divider 220 is therefore arranged to divide a voltage $V_{BN}$, where $V_{BN}$ is the voltage across the terminals 101B and 101N. The divided voltage is provided as the voltage signal $V_{BN}'$ at the intermediate node 223, for example, when referenced to the terminal 101N. The voltage signal $V_{BN}'$ at the intermediate node 223 is therefore indicative of the voltage $V_{BN}$ across the terminals 101B and 101N. Furthermore, when the meter 100 is coupled to a 4-wire three-phase power line as shown in FIG. 1, the voltage $V_{BN}$ across the terminals 101B and 101N corresponds to the voltage across the phase conductor B and neutral conductor N of the power line. Therefore, the voltage signal $V_{BN}'$ at the intermediate node 223 may be indicative of the voltage $V_{BN}$ across the phase conductor B and neutral conductor N of the three phase power line.

The voltage divider 230 is arranged between the input terminals 101C and 101B and comprises resistors $R_{231}$ and $R_{232}$. The arrangement of the voltage divider 230 is substantially similar to the arrangement of the voltage dividers 210 and 220, and is therefore characterised by a similar equation and similar resistor values. The voltage divider 230 is therefore arranged to divide a voltage $V_{CB}$, where $V_{CB}$ is the voltage across the terminals 101C and 101B. The divided voltage is provided as the voltage signal $V_{CB}'$ at the intermediate node 233, for example, when referenced to the terminal 101B. The voltage $V_{CB}'$ at the intermediate node 233 is therefore indicative of the voltage $V_{CB}$ across the terminals 101C and 101B. Furthermore, when the meter 100 is coupled to a three-phase power line as shown in FIG. 1 or otherwise, the voltage $V_{CB}$ across the terminals 101C and 101B corresponds to the voltage $V_{CB}$ across the phase conductors C and B of the power line. Therefore, the voltage signal $V_{CB}'$ at the intermediate node 233 may be indicative of the voltage $V_{CB}$ across the phase conductors C and B of the three phase power line.

Figure 7:
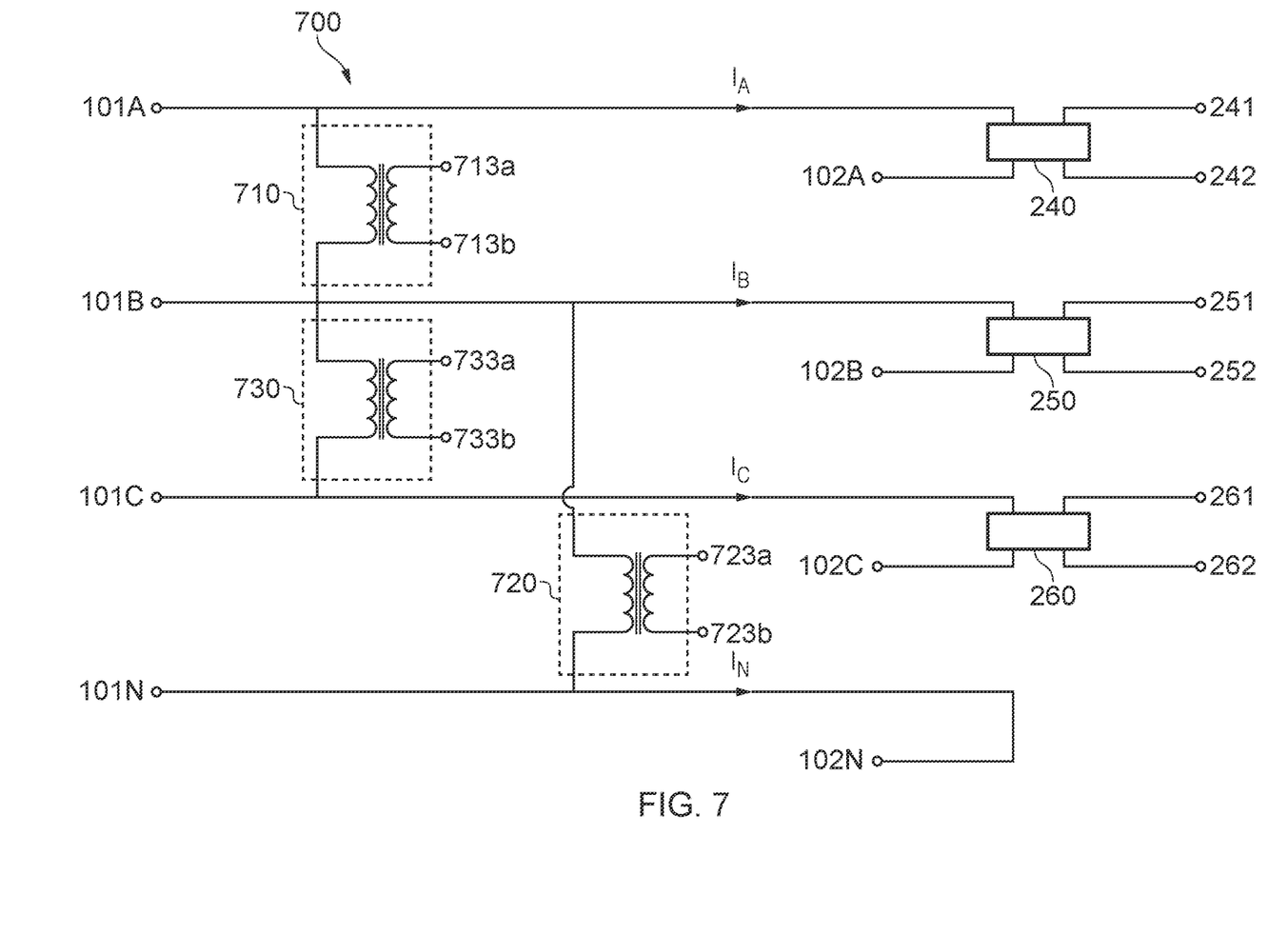
FIG. 7 shows front end circuitry (FEC) of a three-phase power meter in accordance with a further embodiment of the present disclosure.

Although FIG. 2 shows two resistors in each voltage divider, it should be appreciated that other component arrangements may be used to form the voltage dividers. For example, each resistor shown in FIG. 2 may be replaced by a network of series and/or parallel resistors to achieve the desired voltage division at the intermediate nodes. Furthermore, components other than resistors suitable for use in voltage dividers may also be used, including capacitors, inductors or transistors. For example, as shown in FIG. 7 and described in more detail below, the voltage dividers may be replaced with voltage transformers.

Figure 3:
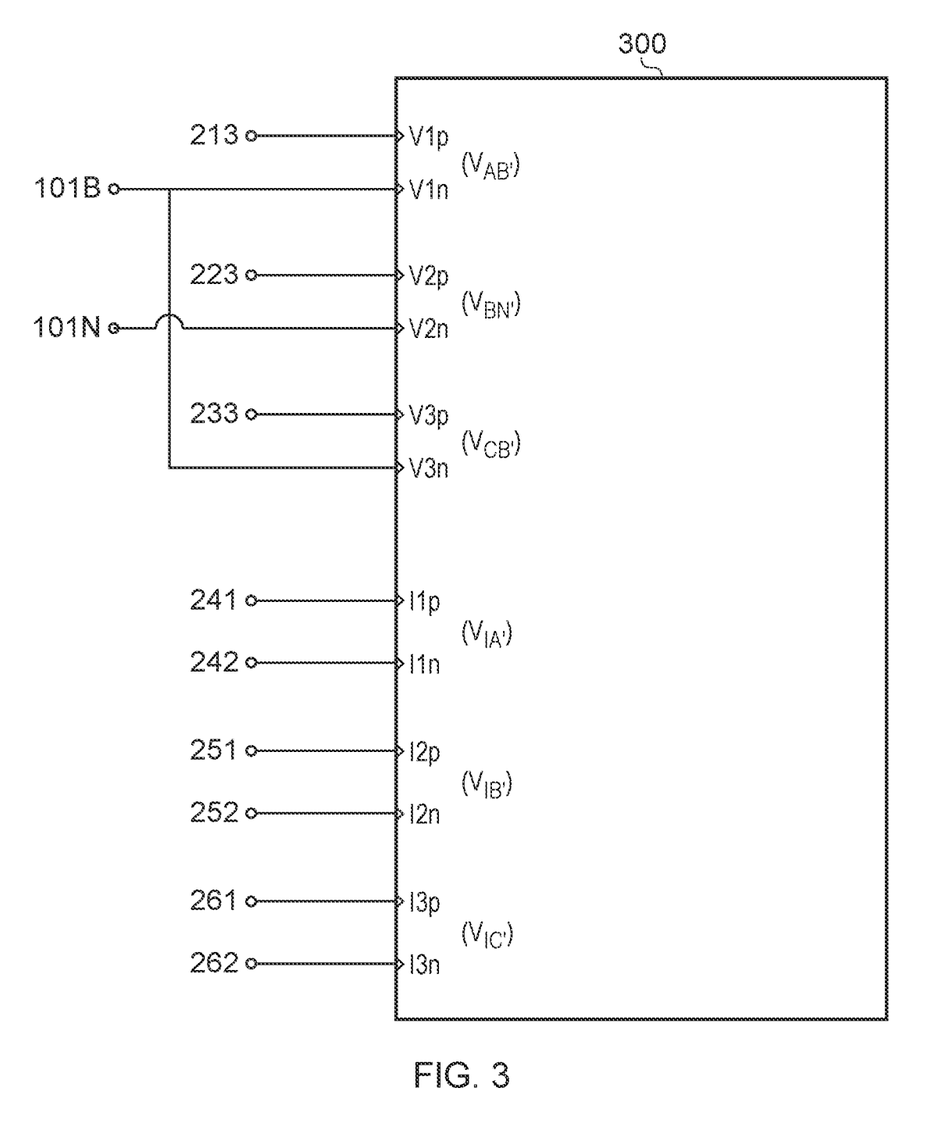
FIG. 3 shows a processing unit of a three-phase power meter in accordance with an embodiment of the present disclosure.

FIG. 3 shows a processing unit 300 in accordance with an embodiment of the present disclosure. The processing unit 300 may be included in the power meter 100 of FIG. 1 as described above, with the FEC 200 of FIG. 2. The processing unit 300 is configured to receive the output signals from the FEC 200. Based on the received signals, the processing unit is configured to determine and monitor the power of a power line that is coupled with the meter 100, such as the power line 110 in FIG. 1 or otherwise.

The processing unit 300 comprises a plurality of differential inputs: V1$p$, V1$n$, V2$p$, V2$n$, V3$p$, V3$n$, I1$p$, I1$n$, I2$p$, I2$n$, I3$p$, and I3$n$. The pairs of differential inputs V1$p$/V1$n$, V2$p$/V2$n$, and V3$p$/V3$n$ are for receiving voltage signals indicative of the voltages between conductors of the power line being monitored. The pairs of differential inputs I1$p$/I1$n$, I2$p$/I2$n$, and I3$p$/I3$n$ are for receiving voltage signals indicative of the current flowing through the phase conductors of the power line being monitored. The processing unit 300 is arranged to measure the signals received at the positive inputs (e.g. V1$p$, I1$p$), with reference to the respective negative inputs (e.g. V1$n$, I1$n$).

FIG. 3 shows how the inputs of the processing unit 300 are coupled to the nodes of the FEC 200 when included in the meter 100.

The positive input V1p is coupled to the intermediate node 213 of the voltage divider 210. The corresponding negative input V1n is coupled to the terminal 101B. The processing unit 300 is therefore arranged to receive the divided voltage signal $V_{AB}'$ that is indicative of the voltage $V_{AB}$ between the terminals 101A and 101B, i.e. between the phase conductors A and B of the 3 or 4 wire three-phase power line being monitored.

The positive input V2p is coupled to the intermediate node 223 of the voltage divider 220. The corresponding negative input V2n is coupled to the terminal 101N. The processing unit is therefore arranged to receive the divided voltage signal $V_{BN}'$ that is indicative of the voltage $V_{BN}$ between the terminals 101B and 101N, i.e. between the phase conductor B and neutral conductor N of the three-phase power line when the meter 100 is coupled to a 4-wire power line.

The positive input V3p is coupled to the intermediate node 233 of the voltage divider 230. The corresponding negative input V3n is coupled to the terminal 101B. The processing unit is therefore arranged to receive the divided voltage signal $V_{CB}'$ that is indicative of the voltage $V_{CB}$ between the terminals 101C and 101B, i.e. between the phase conductors C and B of the 3 or 4 wire three-phase power line being monitored.

The positive input I1p is coupled to the node 241, and the negative input I1n is coupled to the node 242 of the current sensor 240. The processing unit is therefore arranged to receive the voltage signal $V_{IA}'$ indicative of the current $I_A$ flowing between the terminals 101A and 102A, i.e. the current flowing on the phase conductor A of the 3 or 4 wire power line being monitored.

The positive input I2p is coupled to the node 251, and the negative input I2n is coupled to the node 252 of the current sensor 250. The processing unit is therefore arranged to receive the voltage signal $V_{IB}'$ indicative of the current $I_B$ flowing between the terminals 101B and 102B, i.e. the current flowing on the phase conductor B of the 3 or 4 wire power line being monitored.

The positive input I3p is coupled to the node 261, and the negative input I3n is coupled to the node 262 of the current sensor 260. The processing unit is therefore arranged to receive the voltage signal $V_{IC}'$ indicative of the current $I_C$ flowing between the terminals 101C and 102C, i.e. the current flowing on the phase conductor C of the 3 or 4 wire power line being monitored.

Figure 4:
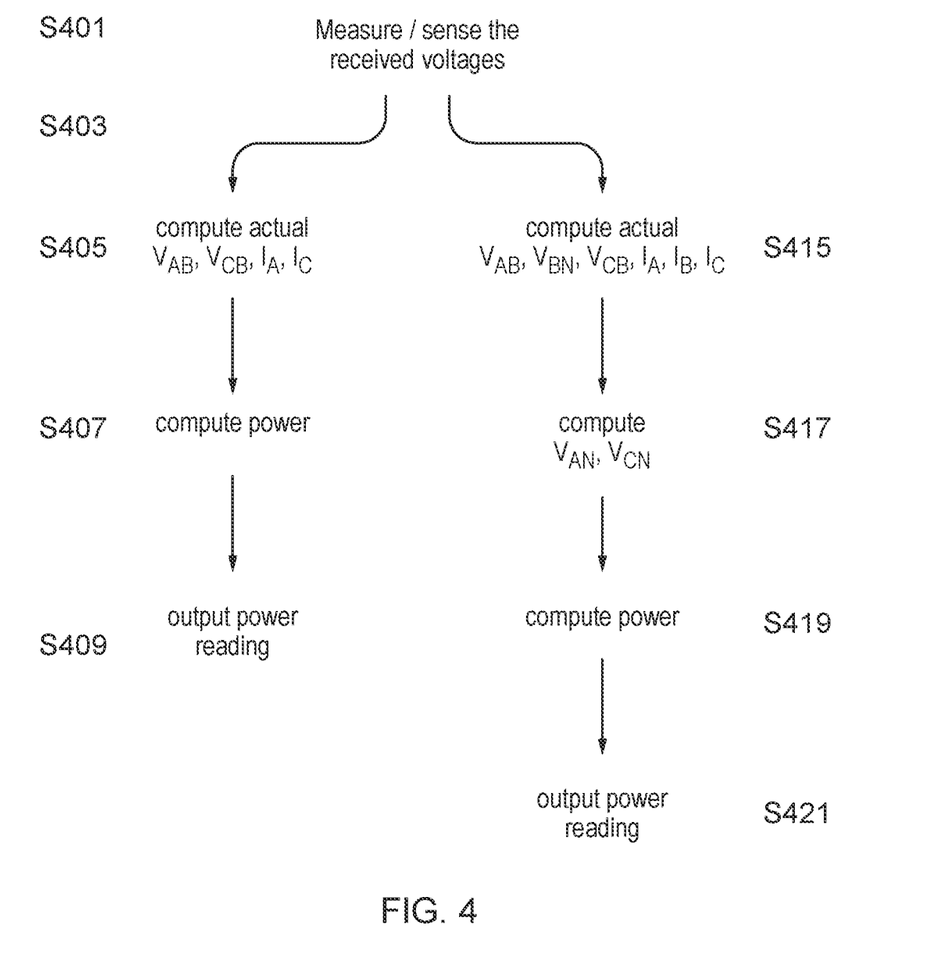
FIG. 4 shows an operational flow diagram of a three-phase power meter in accordance with an embodiment of the present disclosure.

FIG. 4 illustrates the processing steps implemented by the processing unit 300 to determine and monitor the power of a 3 or 4 wire power line coupled with the meter 100.

In summary, the processing unit 300 measures or senses voltage signals received from the FEC 200. The measured or sensed voltage signals are indicative of voltages across the conductors of the power line being monitored, and indicative of currents through the phase conductors of the power line being monitored. The processing unit 300 is configured to then operate in a first mode or a second mode of operation to determine and monitor a power of a three-phase power line coupled with the meter 100. The processing unit 300 may operate in the first mode of operation when the meter 100 is coupled to a 3-phase 3-wire power line (i.e. a three-phase power line with three phase conductors A, B and C, and no neutral conductor N). The processing unit 300 may operate in the second mode of operation when the meter 100 is coupled to a 3-phase 4-wire power line (i.e. a three-phase power line with three phase conductors A, B and C, and a neutral conductor N, as shown in FIG. 1). The processing unit 300 employs specific computations and techniques to determine the power of each type of power line, as described in more detail below.

At step S401, the processing unit 300 measures or senses the voltage signals $V_{AB}'$, $V_{BN}'$, $V_{CB}'$, $V_{IA}'$, $V_{IB}'$, $V_{IC}'$ received from the FEC 200. The processing unit 300 may sample and convert the received voltage signals into digital signals using a plurality of analog-to-digital converters (ADCs). When the meter is coupled to a three-phase power line, the voltage signals will be time varying, for example, at fundamental or harmonic frequencies of the power line. The processing unit 300 may therefore continuously receive and sample the instantaneous voltage signals $V_{AB}'$, $V_{BN}'$, $V_{CB}'$, $V_{IA}'$, $V_{IB}'$, $V_{IC}'$ at a suitable sampling rate.

As indicated at step S403, the processing unit 300 is configured to operate in a first mode or a second mode. In particular, at step S403, the processing unit 300 may determine whether the meter 100 is coupled to a 3-wire power line or a 4-wire power line. The processing unit 300 may operate in the first mode of operation when the meter 100 is coupled to a 3-phase 3-wire power line, and in the second mode of operation when the meter 100 is coupled to a 4-wire power line.

In the first mode of operation, at step S405, the processing unit 300 determines the actual instantaneous voltages $V_{AB}$ and $V_{CB}$ of the power line. In some embodiments, the processing unit 300 may determine the voltage $V_{AB}$ by multiplying $V_{AB}'$ by a compensation gain to compensate for the dividing effect of the voltage divider 210. Similarly, the processing unit 300 may determine the voltage $V_{CB}$ by multiplying $V_{CB}'$ by a respective compensation gain to compensate for the dividing effect of the voltage divider 230.

The compensation gains may be pre-programmed into registers of the processing unit 300. The compensation gains may be based on the values of the resistors of each voltage divider. In some embodiments, each compensation gain may be determined and calibrated offline and stored in registers of the processing unit 300. The calibration may involve: inputting a known voltage signal through a voltage divider, determining the divided voltage signal measured by the processing unit 300 (e.g. at the output of the ADCs of the processing unit 300), and determining the compensation gain as the gain between the known inputted signal and measured divided signal.

Furthermore, at step S405, the processing unit 300 determines the actual instantaneous currents $I_A$ and $I_C$ of the power line. The current $I_A$ may be determined by multiplying $V_{IA}'$ by a conversion gain to convert the voltage signal $V_{IA}'$ into the current $I_A$. Similarly, the current $I_C$ may be determined by multiplying $V_{IC}'$ by a respective conversion gain.

The conversion gains may be pre-programmed into registers of the processing unit 300 to be used when executing step S405. The conversion gains may be based on parameters of the current sensors 240 and 260, such as their impedance between the output nodes 241 and 242, and 261 and 262. In some embodiments, each conversion gain may be determined and calibrated offline and stored in registers of the processing unit 300. The calibration may involve: inputting a known current signal through a current sensor, determining the voltage signal measured by the processing unit 300 that is indicative of the current (e.g. at the output of the ADCs of the processing unit 300), and determining the conversion gain as the gain between the known inputted signal and measured signal.

At step S407, the processing unit 300 determines the power on the 3-phase 3-wire line coupled with the meter 100 (i.e. the power being consumed or produced by the load). In accordance with Blondel's Theorem, if the phase conductor B is considered as a common reference point of the 3-wire line, the power of the 3-phase 3-wire line may be determined using the two voltages $V_{AB}$ and $V_{CB}$, and the two currents $I_A$ and $I_C$. Therefore, in the first mode of operation, the processing unit 300 determines the power based on the determined instantaneous voltages $V_{AB}$ and $V_{CB}$, and the determined instantaneous currents $I_A$ and $I_C$.

Different types of power quantities of the power line may be determined using the instantaneous voltages $V_{AB}$, $V_{CB}$ and currents $I_A$, $I_C$. For example, the instantaneous voltages and currents may be used to determine one or more of the total active, reactive and apparent powers on the power line. Furthermore, the instantaneous voltages and currents may also be used to determine one or more of the active, reactive and apparent powers of constituent frequency components of power transmission signals on the power line, such as the powers at the fundamental frequency and at individual harmonic frequencies of the power transmission signals on the power line. The processing unit 300 may be configured to employ any known technique of computing any one or more of the above power quantities on the 3-phase 3-wire power line, based on the instantaneous voltages and currents $V_{AB}$, $V_{CB}$, $I_A$, $I_C$. As an example, computing the total active power on the 3-phase 3-wire power line may involve first computing the instantaneous powers $P_A = V_{AB} \times I_A$ and $P_C = V_{CB} \times I_C$ on the respective phase conductors A and C. The instantaneous powers $P_A$ and $P_C$ may then be used to determine power quantities $P_{A\text{-}Active}$ and $P_{C\text{-}Active}$ which are the total active powers on the phase conductors A and C respectively. In accordance with Blondel's Theorem, computing the overall total active power $P_{3w\text{-}Active}$ may involve summing the power quantities $P_{A\text{-}Active}$ and $P_{C\text{-}Active}$. Any other additional, alternative or intermediate computational steps for computing the power may be envisaged by the skilled person based on known techniques.

Determining power quantities may also involve storing or registering current and past instantaneous voltage, current or power values for use in the power calculations.

At step S409, the processing unit 300 may output a signal indicative of the determined power, such as the total active power $P_{3w\text{-}Active}$. In some embodiments, the processing unit 300 may be in communication with a display device that receives the output signal and displays the power quantity. The display device may be included in the meter 100, or be external to the meter 100. Alternatively or additionally, the processing unit 300 may be in communication with any other device for displaying, recording or analysing the determined powers.

The processing unit 300 may operate in the second mode of operation when the meter 100 is coupled to a 3-phase 4-wire power line. In the second mode of operation, at step S415, the processing unit 300 determines the actual voltages and currents $V_{AB}$, $V_{CB}$, $I_A$ and $I_C$ as described above. Furthermore, in the second mode of operation, the processing unit also determines the actual voltage $V_{BN}$ and the current $I_B$. Similarly to determining $V_{AB}$ and $V_{CB}$, the processing unit 300 may determine the instantaneous voltage $V_{BN}$ by multiplying $V_{BN}'$ by a respective compensation gain to compensate for the dividing effect of the voltage divider 220. Similarly to determining $I_A$ and $I_C$, the processing unit 300 may determine the instantaneous current $I_B$ by multiplying $V_{IB}'$ by a respective conversion gain. The respective compensation gains and conversion gains may be determined and/or pre-programmed into registers of the processing unit as described above.

At step S417, the processing unit 300 determines the instantaneous voltages $V_{AN}$ and $V_{CN}$. The voltage $V_{AN}$ corresponds to a voltage between a phase conductor A and a neutral conductor N of the 3-phase 4-wire line being monitored, such as the power line shown in FIG. 1. The voltage $V_{CN}$ corresponds to a voltage between a phase conductor C and the neutral conductor N of the 3-phase 4-wire line being monitored. Since the voltages $V_{AN}$ and $V_{CN}$ are not directly measured by the meter 100, the processing unit 300 determines those voltages as:

$$V_{AN} = V_{AB} + V_{BN}$$

$$V_{CN} = V_{CB} + V_{BN}$$

Therefore, the instantaneous voltages $V_{AN}$ and $V_{CN}$ are made available. The voltage $V_{BN}$ is already available at this step as it is measured by the meter 100.

In the second mode of operation at step S419, the processing unit 300 determines a power of the 3-phase 4-wire line coupled with the meter. In accordance with Blondel's Theorem, if the neutral conductor N is considered as a common reference point of the 4-wire line, the power may be determined using the voltages $V_{AN}$, $V_{BN}$, $V_{CN}$, and the currents $I_A$, $I_B$, $I_C$. Therefore, in the second mode of operation, the processing unit 300 determines the power based on the determined instantaneous voltages $V_{AN}$, $V_{BN}$, $V_{CN}$ and the determined instantaneous currents $I_A$, $I_B$ and $I_C$.

As explained above, different power quantities of the power line may be determined based on the instantaneous voltages and currents. The processing unit 300 may be configured to employ any known technique of computing any one or more of the previously described power quantities on a 3-phase 4-wire power line based on the instantaneous voltages and currents $V_{AN}$, $V_{BN}$, $V_{CN}$, $I_A$, $I_B$, $I_C$. As an example, computing the total active power may involve first computing the instantaneous powers $P_A = V_{AN} \times I_A$, $P_B = V_{BN} \times I_B$, and $P_C = V_{CN} \times I_C$ on the respective phase conductors A, B and C. The instantaneous powers $P_A$, PB, $P_C$ may then be used to determine power quantities $P_{A\text{-}Active}$, $P_{B\text{-}Active}$ and $P_{C\text{-}Active}$ which are the total active powers on each phase conductor A, B and C respectively. In accordance with Blondel's Theorem, computing the overall total active power $P_{4w\text{-}Active}$ may involve summing the powers $P_{A\text{-}Active}$, $P_{B\text{-}Active}$, $P_{C\text{-}Active}$. Any other additional, alternative or intermediate computational steps for computing the power may be envisaged by the skilled person. Determining power quantities may also involve storing or registering current and past instantaneous voltage, current or power values for use in the power calculations.

At step S421, similarly to step S409, the processing unit 300 may output a signal indicative of the determined power, such as the total active power $P_{4w\text{-}Active}$. The signal may be outputted to the display device or any other device as described above.

In each mode of operation, the processing unit 300 may repeat the steps in FIG. 4 to continuously monitor the power or any of the power quantities on the 3-phase 3-wire or 3-phase 4-wire power line coupled with the meter 100.

In some embodiments, the processing unit 300 may be configured to receive user input to select the operating mode of the processing unit 300. For example, the processing unit 300 may be in communication with a user input device (not shown). The user input device may be any device or controller that allows a user to select a first operating mode when the meter 100 is coupled to a 3-wire line, and select a second operating mode when the meter 100 is coupled to a 4-wire line. At step S403 of the method in FIG. 4, the processing unit 300 may check the user selected mode and proceed with the method according to the first or second mode accordingly. The user input device may be included in the meter 100, or be external to the meter 100. In some examples, the user input device may be a switch, button, or a touchscreen device.

In other embodiments, the processing unit 300 may be configured to automatically determine its operating mode. In particular, the processing unit 300 may be configured to automatically detect whether the meter 100 is coupled to a 3-phase 3-wire power line, or a 3-phase 4-wire power line. If the processing unit 300 determines that it is coupled to a 3-phase 3-wire line, the processing unit may automatically set itself to operate in the first operating mode. If the processing unit 300 determines that it is coupled to a 3-phase 4-wire line, the processing unit may automatically set itself to operate in the second operating mode.

In some embodiments, the processing unit 300 may determine whether it is coupled to a 3-wire or 4-wire power line based on the magnitude of the voltage signal $V_{BN}'$. The magnitude of $V_{BN}'$ may preferably be determined as the RMS of the voltage signal $V_{BN}'$, but may also be determined as the instantaneous peak value, or peak-to-peak magnitude. A $V_{BN}'$ magnitude of approximately 0V may indicate that the neutral terminals 101N and 102N of the meter 100 are not connected to a neutral conductor N. Therefore, it can be assumed that there is no neutral conductor present and that the meter 100 is coupled to a 3-wire power line. Hence, the processing unit may compare the voltage signal $V_{BN}'$ to a threshold value $V_T$. If $V_{BN}'$ does not exceed the threshold value $V_T$, the processing unit 300 may determine it is coupled to a 3-wire line and operate in the first mode of operation. Otherwise, if $V_{BN}'$ exceeds the threshold value $V_T$, the processing unit 300 may determine it is coupled to a 4-wire line and operate in the second mode of operation.

The threshold $V_T$ may be any value appropriate for distinguishing whether the meter 100 is coupled to a neutral conductor. $V_T$ may be determined empirically during calibration of the meter 100, or theoretically, using methods known to the skilled person. Furthermore, it may not be necessary to continuously determine the operating mode. Rather, in some embodiments, the processing unit 300 may automatically determine the operating mode after a reset event (e.g. when the processing unit 100 is powered up or reset). The processing unit 300 may then continue to operate in that operating mode when executing the method in FIG. 4. The processing unit 300 may then re-determine the operating mode only when another reset event occurs.

The processing unit 300 may be any processing device known to the skilled person that is suitable for performing or executing the methods of the present disclosure. For example, in some embodiments, the processing unit 300 may be any microcontroller, microprocessor, logic circuit, integrated circuit or combinations thereof. The processing unit 300 may also be any three-phase metering integrated circuit that is configurable to perform the methods of the present disclosure. As such, the processing unit 300 may be implemented as a single integrated circuit comprising components for executing the methods described herein, such as anti-aliasing filters, analog-to-digital converters (ADCs), digital signal processors, storage registers, data interfaces, and control interfaces.

In some embodiments, the processing unit 300 may be implemented as a plurality of one or more integrated circuits (ICs). For example, as shown in FIG. 5, the processing unit 300 may comprise a plurality of ADC integrated circuits (ADC-ICs) 501, 502, 503, and a digital processor IC 504.

Figure 5:
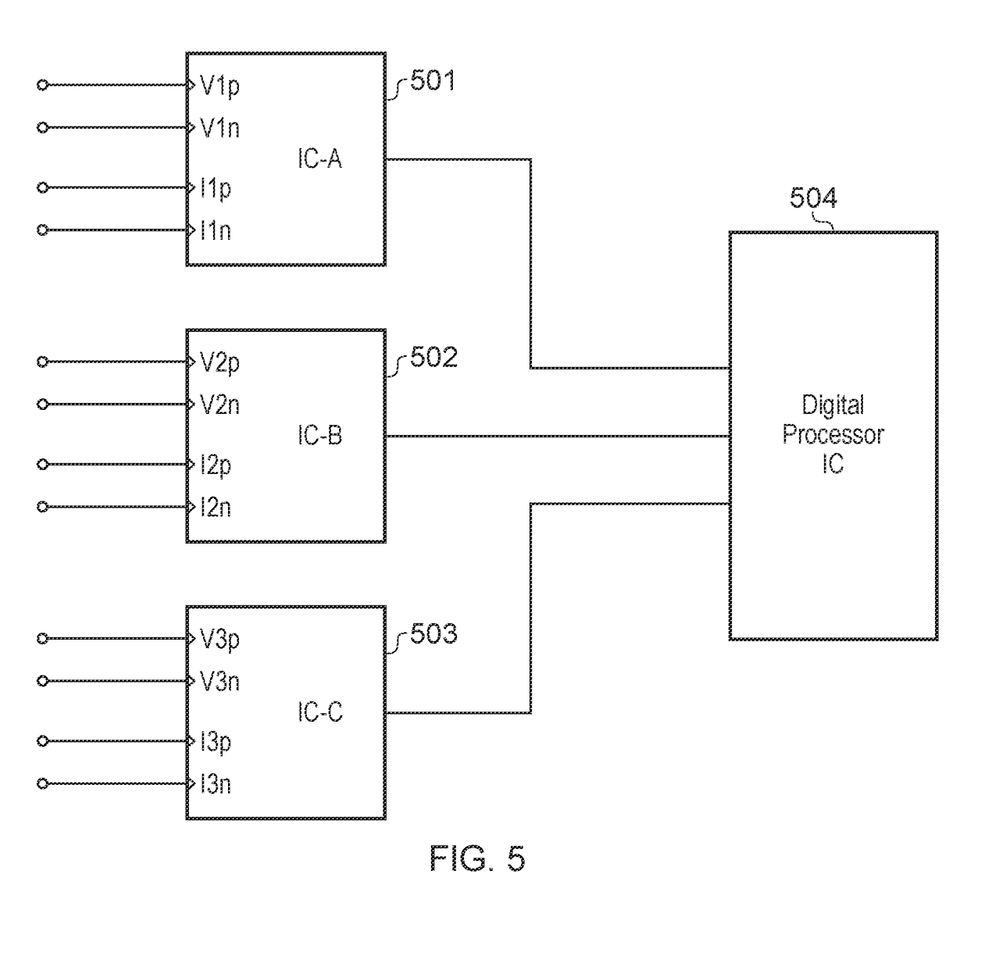
FIG. 5 shows components of a processing unit in accordance with an embodiment of the present disclosure.

In the example of FIG. 5, an ADC-IC 501, 502, 503 is provided for each phase conductor A, B and C of the three-phase power line being monitored. The ADC-IC 501 comprises the differential inputs V1p, V1n, I1p and I1n for coupling to nodes the front end circuitry 200. The differential inputs may be coupled to nodes of the circuitry 200 as described above and shown in FIG. 3 and as indicated by their like reference signs. Therefore, the ADC-IC 501 may receive signals from the front end circuitry 200 at its differential inputs as already described. Furthermore, the differential inputs of the ADC-ICs 502 and 503 may also be coupled to nodes of the circuitry 200 and receive signals from the front end circuitry 200 as already described above and as indicated by their like reference signs.

Each ADC-IC 501, 502, 503 is configured to convert the received signals into digital signals. The ADC-ICs may comprise an individual ADC for each pair of differential inputs.

The ADC-ICs 501, 502, 503 are arranged to provide the digital signals to the digital processor IC 504. The digital processor IC 504 is configured to perform processing or operational steps in accordance with the methods of the present disclosure. For example, the digital processor IC 504 may perform the calculations and operations described in respect of FIG. 4.

The ADC-ICs 501, 502, 503 may be any type of ADC-IC that can be arranged as shown in FIG. 5 and perform the operations described herein. In some embodiments, the ADC-ICs 501, 502, 503 may be isolated ADC-ICs providing an isolation barrier between the digital (output) side and analog (input) side of the ICs. The digital processor IC 504 may be any digital processor IC or microprocessor configurable to interface with the ADC-ICs and perform the steps of the methods of the present disclosure.

As such, the processing unit 300 may be implemented as a single integrated circuit, or as a plurality of one or more integrated circuits.

Various modifications, variations and implementations of the present disclosure are now described as follows.

In some embodiments of the present disclosure, each voltage divider 210, 220, 230 in the FEC 200 of FIG. 2 may be replaced with a voltage transformer. FIG. 7 shows an example of a front end circuit (FEC) 700 that comprises voltage transformers 710, 720, 730 in place of the voltage dividers of the FEC 200 in FIG. 2. All other aspects of the FEC 700 of FIG. 7 are similar to the FEC 200 of FIG. 2. The voltage transformer 710 is arranged to receive input from the pair of terminals 101A and 101B. The voltage transformer 710 is arranged to reduce or step down the voltage $V_{AB}$ between the terminals 101A and 101B to provide a reduced voltage signal $V_{AB}'$ between its output terminals 713a and 713b. The level of voltage reduction provided by the voltage transformer 710 may be set by the turns-ratio between the primary and secondary coil windings of the voltage transformer 710. The voltage transformers 720 and 730 are similarly arranged to receive input from the respective pairs of terminals 101B/101N and 101C/101B, and to reduce or step down each voltage $V_{BN}$ and $V_{CB}$ to provide the reduced voltage signals $V_{BN}'$ and $V_{CB}'$ between the voltage transformer outputs 723a/723b and 733a/733b. When using the FEC 700 in the meter 100, the processing unit 300 may be coupled to the FEC 700 differently to what is shown in FIG.

3 in order to receive the voltage signals $V_{AB}'$, $V_{BN}'$ and $V_{CB}'$. In particular, the differential inputs V1p and V1n may couple to the outputs 713a and 713b of the transformer 710. Similarly, the differential inputs V2p and V2n may couple to the outputs 723a and 723b of the transformer 720, and the differential inputs V3p and V3n may couple to the outputs 733a and 733b of the transformer 730. The remaining differential inputs may couple to the FEC 700 as previous described with respect to the FEC 200. Subsequently, at steps S405 and S415 of the method shown in FIG. 4, the processing unit 300 may use or determine appropriate compensation gains as previously described in order to compensate for the step down or reducing effect of the voltage transformers and determine the actual voltages $V_{AB}$, $V_{CB}$ and $V_{BN}$. Therefore, when using the FEC 700, the compensation gains may be dependent on the turns-ratios of the voltage transformers. The voltage dividers and voltage transformers of the present disclosure may more generally be referred to as voltage generators.

In the present disclosure, the processing unit 300 has been described as measuring the voltage signal $V_{AB}'$ indicative of the voltage $V_{AB}$ by referencing the intermediate node 213 of the voltage divider 210 with respect to the input terminal 101B. However, it should be appreciated that any other equivalent node may be used as a reference, such as the output terminal 102B, or any other equivalent node that has the same electrical potential level of the phase conductor B. Similarly, any other equivalent nodes may be used as reference for measuring any other voltage, such as the voltage signals $V_{CB}'$ and $V_{BN}'$, $V_{IA}'$, $V_{IB}'$, and $V_{IC}'$.

In some embodiments, the divided voltages may be measured by the processing unit 300 with respect to alternative reference nodes. For example, it has been described above how the voltage divider 220 is arranged to provide a divided voltage signal $V_{BN}'$ at the node 223 when referenced to the neutral conductor N at the terminal 101N. However, the voltage divider 220 may be arranged in an opposite way to provide a divided voltage signal $V_{NB}'$ at the node 223 when referenced to the phase conductor B. The processing unit 300 may be arranged to measure the divided signal $V_{NB}'$ by coupling the node 223 to the positive input V2p, and the terminal 101B (or any other node that has the same electrical potential as the phase conductor B) to the negative input V2n. A respective compensation gain may be used accordingly to determine the voltage $V_{NB}$ at step S415 of the method in FIG. 4. Subsequently, the voltage $V_{BN}$ may be determined as $V_{BN} = -V_{NB}$ at step S417 of the method in FIG. 4, and then $V_{BN}$ used to determine power as described at step S419. As such, the alternative referencing and voltage divider arrangement may be used to determine the voltage $V_{BN}$. Measuring $V_{NB}'$ instead of $V_{BN}'$ allows for the phase conductor B to be used as a common reference for all of the voltage signals $V_{AB}'$, $V_{CB}'$ and $V_{NB}$. This may allow the meter 100 to be implemented with a processing unit 300 that only allows for a single common reference input to all of the negative inputs. Nevertheless, in some embodiments, the voltages $V_{BN}$, $V_{AB}$ and $V_{CB}$ may be determined using alternative referencing as described above in any combination in order to meet the implementation requirements of the processing unit 300. For example, some implementations of the processing unit shown in FIG. 5 may require that each ADC-IC 501, 502, 503 is referenced to the respective phase conductors A, B or C at the negative voltage inputs V1n, V2n, V3n, respectively, in order to achieve better isolation between the conductors. Therefore, the voltage dividers of the FEC may be arranged such that the ADC-ICs measure the voltages $V_{BA}'$, $V_{BC}'$ and $V_{NB}'$. These voltages may be compensated and negated in order to determine the voltages $V_{AB}$, $V_{CB}$ and $V_{BN}$ as described above in order to determine power.

The voltage signals $V_{IA}'$, $V_{IB}'$, and $V_{IC}'$ indicative of currents may also be referenced in an opposite way at the respective positive and negative inputs to the processing unit 300. Other equivalent or alternative means of referencing any of the measured signals may be envisaged.

In the present disclosure, the meter 100 is arranged to determine power based on the determined voltages $V_{AB}$, $V_{CB}$ and $V_{BN}$, where the phase conductor B is the common phase conductor between the pairs of conductors and voltage measurements. It should be appreciated that the meter 100 may be arranged to determine power based on any other conceptually similar pairs of voltages. For example, the meter 100 may be arranged to determine power based on the determined voltages $V_{AC}$, $V_{BC}$ and $V_{CN}$, where the phase conductor C is the common phase conductor between the pairs of voltage measurements. Alternatively, the meter 100 may be arranged to determine power based on the voltages $V_{BA}$, $V_{CA}$, and $V_{AN}$, where the phase conductor A is the common phase conductor between the pairs of voltage measurements. The skilled person will appreciate that these alternative arrangements can be implemented similarly to the arrangement described in the present disclosure, whilst having the same advantages.

In the present disclosure, it has been described how the FEC 200 does not comprise a current sensor between the neutral terminals 101N and 102N. However, in some embodiments, the FEC may comprise a neutral current sensor between the neutral terminals 101N and 102N. The neutral current sensor may be similarly arranged to the current sensors between the other terminals of the meter 100. The neutral current sensor may output a voltage signal $V_{IN}'$ at its output nodes, where $V_{IN}'$ is indicative of the current $I_N$ between the terminals 101N and 102N, and therefore the current $I_N$ on the conductor N when coupled to a neutral conductor. The output of the neutral current sensor may be coupled to respective differential inputs to the processing unit 300, so that the processing unit 300 may determine the neutral current $I_N$ similarly to how it determines the other currents $I_A$, $I_B$, $I_C$. Furthermore, in the embodiment of FIG. 5, the processing unit 300 may comprise an additional ADC-IC for determining the neutral current $I_N$. The determined current $I_N$ may be useful for detecting defects and tampering in relation to the power meter and/or the power line.

As described in the present disclosure, the voltage dividers or voltage transformers provide signals at a measurable level that meets the safety requirements and maximum ratings of the components of the meter 100, such as the components of the processing unit 300. However, in some scenarios, the voltages on the conductors of the power line may already be at a safe and measurable level. Therefore, in some embodiments, the voltage dividers and voltage transformers may be omitted and the terminals of the meter 100 may be coupled directly to the respective differential inputs of the processing unit 300 in order to measure voltages $V_{AB}$, $V_{CB}$, and $V_{BN}$.

In the present disclosure, the FEC 200/700 provides signals indicative of currents and voltages on the power line in the form of voltage signals $V_{AB}'$, $V_{CB}'$, $V_{BN}'$, $V_{IA}'$, $V_{IB}'$, or $V_{IC}'$. However, in some embodiments the FEC 200/700 may be arranged to provide one or more of its output signals as current signals instead of voltage signals, and the processing unit 300 may be configured to receive current signals and perform power computations based on the received current signals.

In the present disclosure, it has been described how the power meter 100 is arranged to measure or determine instantaneous voltages and currents of the power line that the power meter 100 is coupled to, and the power meter 100 is configured to determine the power or various power quantities on a power line based on the instantaneous voltages and currents. It should be appreciated that the power meter may be configured to determine any other suitable quantity or parameter in relation to the power line. For example, the power meter 100 may be configured to determine one or more of the following quantities: energy (e.g. in Joules), kilo-watt hours (kWHrs), RMS currents/voltages, and power factor. More generally, the meter 100 may be considered as an energy meter configured to determine any of the above quantities. The skilled person may apply any known or common techniques in order to configure the power meter 100 to determine the above quantities or parameters based on the measured instantaneous voltages and currents.

The present disclosure also provides a method comprising: coupling the meter 100 to conductors of a 3-wire or 4-wire three-phase power line; and setting the power meter 100 in the first mode in the event that the meter has been coupled to a 3-wire power line, or setting the power meter 100 in the second mode in the event that the meter has been coupled to a 4-wire power line. The method may further include, using the power meter, generating a plurality of signals indicative of voltages between at least two of the conductors, and determining the power of the three-phase power line.

The appended claims are presented without using multiple dependencies, however, it should be understood that the various dependent claims (or aspects thereof) can be used in any permutation or combination with other claims, unless expressly indicated otherwise by the present detailed description in the specification.

The invention claimed is:

1. A three-phase power meter, comprising:
   a front-end circuit (FEC) configured for coupling to a three wire or a four wire three-phase power line comprising a plurality of conductors, and to generate a plurality of signals indicative of voltages between respective pairs of conductors; and
   a processing unit, coupled to the FEC, and configured to receive the plurality of signals, and to determine power being transferred by the three-phase power line,
   wherein the power meter is configured to operate in a first mode of operation, in order to determine the power being transferred by a three wire three-phase power line, and in a second mode of operation, in order to determine the power being transferred by a four wire three-phase power line, and
   wherein the FEC is configured to determine the power being transferred in the first mode of operation based on only a first phase-to-phase voltage and a second phase-to-phase voltage, and
   wherein the FEC is configured to determine the power being transferred in the second mode of operation based on only the first phase-to-phase voltage, the second phase-to-phase voltage, and a phase-to-neutral voltage.

2. The three-phase power meter of claim 1, wherein the FEC comprises a plurality of voltage generators, each generator arranged to be coupled between a pair of conductors, and each configured to generate at least one of the plurality of signals indicative of voltages between respective pairs of conductors.

3. The three-phase power meter of claim 2, wherein the plurality of voltage generators includes a first and a second voltage generator arranged to be coupled between respective pairs of phase conductors, and a third voltage generator arranged to be coupled between a phase conductor and a neutral conductor.

4. The three-phase power meter of claim 2, wherein the FEC comprises:
   a plurality of terminals for coupling to respective conductors of a three-phase power line, wherein the plurality of voltage generators include a plurality of voltage dividers arranged between the plurality of terminals.

5. The three-phase power meter of claim 4, wherein:
   the plurality of terminals includes at least three phase-terminals for coupling to respective phase conductors of a three-phase power line, and at least one neutral terminal for coupling to a neutral conductor of a three-phase power line; and
   the plurality of voltage dividers comprises:
   a first voltage divider arranged between a first phase terminal and a second phase terminal;
   a second voltage divider arranged between a third phase terminal and the second phase terminal; and
   a third voltage divider is arranged between the second phase terminal and the neutral terminal.

6. The three-phase power meter of claim 2, wherein the FEC comprises:
   a plurality of terminals for coupling to respective conductors of a three-phase power line, wherein the plurality of voltage generators are a plurality of voltage transformers arranged between the terminals.

7. The three-phase power meter of claim 1, wherein, when the FEC is coupled to either three or four wire power lines, the FEC is configured to generate two signals indicative of the first phase-to-phase voltage and the second phase-to-phase voltage of the three-phase power line, and, when coupled to a four wire power line, the FEC is configured to generate one signal indicative of a voltage between a phase conductor and a neutral conductor of the three-phase power line.

8. The three-phase power meter of claim 7, wherein:
   in the first mode of operation, the processing unit is configured to determine the power being transferred based on the two signals indicative of the first phase-to-phase voltage and the second phase-to-phase voltage of the three-phase power line; and
   in the second mode of operation, the processing unit is configured to determine the power being transferred based on the two signals indicative of the first phase-to-phase voltage and the second phase-to-phase voltage of the three-phase power line, and the signal indicative of a voltage between a phase conductor and a neutral conductor of the three-phase power line.

9. The three-phase power meter of claim 7, wherein the FEC is configured to generate:
   when coupled to a three or four wire power line, a first signal indicative of the first phase-to-phase voltage between a first phase conductor and a second phase conductor of the three-phase power line;
   when coupled to a three or four wire power line, a second signal indicative of the second phase-to-phase voltage between a third phase conductor and the second phase conductor of the three-phase power line; and when coupled to a four wire power line, a third signal indicative of the phase-to-neutral voltage between the second phase conductor and a neutral conductor of the three-phase power line.

10. The three-phase power meter of claim 9, wherein:
in the first mode of operation, the processing unit is configured to determine the power being transferred based on the first signal and the second signal; and
in the second mode of operation, the processing unit is configured to determine the power being transferred based on the first, second and third signals.

11. The three-phase power meter of claim 1, wherein the FEC is further configured to generate a plurality of signals indicative of currents on respective phase conductors of the three-phase power line, and the processing unit is arranged to receive said signals indicative of currents and to determine power being transferred based on the received signals indicative of the voltages and the received signals indicative of the currents.

12. The three-phase power meter of claim 11, wherein the FEC comprises:
a plurality of current sensors for coupling to phase conductors of a three-phase power line, each current sensor configured to output a signal indicative of a current on the respective phase conductors.

13. The three-phase power meter of claim 1, wherein the processing unit is configured to receive user input to control the operating mode of the power meter.

14. The three-phase power meter of claim 1, wherein the processing unit is configured to automatically determine the operating mode of the power meter based on at least one of the received signals.

15. A front-end circuit (FEC) for use in a three-phase power meter, the FEC configured for coupling to a three wire or a four wire three-phase power line comprising a plurality of conductors, and to generate a plurality of signals indicative of voltages between respective pairs of conductors of the three-phase power line, such that the three-phase power meter is configured to determine a power being transferred by a three-phase three-wire power line in a first mode of operation based on only 1) a first phase-to-phase voltage and 2) a second phase-to-phase voltage, and determine a power being transferred by a three-phase four-wire power line in a second mode of operation based on only 1) the first phase-to-phase voltage, 2) the second phase-to-phase voltage, and 3) a phase-to-neutral voltage.

16. The FEC of claim 15, further comprising a plurality of voltage generators, each generator arranged to be coupled between a pair of conductors, and each configured to generate at least one of the plurality of signals indicative of voltages between respective pairs of conductors.

17. The FEC of claim 16, wherein the plurality of voltage generators include a first and a second voltage generator arranged to be coupled between respective pairs of phase conductors, and a third voltage generator arranged to be coupled between a phase conductor and a neutral conductor.

18. The FEC of claim 17, further comprising:
a plurality of terminals including at least three phase-terminals for coupling to respective phase conductors of a three-phase power line, and at least one neutral-terminal for coupling to a neutral conductor of a three-phase power line; and
the plurality of voltage generators comprise:
a first voltage divider arranged between a first phase terminal and a second phase terminal;
a second voltage divider arranged between a third phase terminal and the second phase terminal; and
a third voltage divider is arranged between the second phase terminal and the neutral terminal.

19. A method of determining a power measurement of a three wire or a four wire three-phase power line using a three-phase power meter, the three-phase power line comprising a plurality of conductors, the method comprising:
receiving, using a processing unit, a plurality of signals indicative of voltages between respective pairs of conductors;
determining whether the three-phase power meter is coupled to a three wire power line based on only 1) a first phase-to-phase voltage and 2) a second phase-to-phase voltage or a four wire power line based on only 1) the first phase-to-phase voltage, 2) the second phase-to-phase voltage, and 3) a phase-to-neutral voltage; and
processing the plurality of signals, using the processing unit, in order to determine the power being transferred on the three-phase power line, wherein the processing of the plurality of signals is dependent upon whether the meter is coupled to a three wire or four wire power line.

20. The method of claim 19, wherein determining the power measurement is performed by a processing unit.

* * * * *